(12) United States Patent
Lazaro et al.

(10) Patent No.: US 12,507,468 B2
(45) Date of Patent: Dec. 23, 2025

(54) BIASING ISOLATION REGION IN SEMICONDUCTOR SUBSTRATE

(71) Applicant: TEXAS INSTRUMENTS INCORPORATED, Dallas, TX (US)

(72) Inventors: Orlando Lazaro, Cary, NC (US); John Russell Broze, Dallas, TX (US); Timothy Bryan Merkin, Princeton, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1 day.

(21) Appl. No.: 18/192,956

(22) Filed: Mar. 30, 2023

(65) Prior Publication Data
US 2023/0335547 A1    Oct. 19, 2023

Related U.S. Application Data

(60) Provisional application No. 63/330,601, filed on Apr. 13, 2022.

(51) Int. Cl.
*H10D 84/80* (2025.01)
*H03K 17/687* (2006.01)
*H10D 84/83* (2025.01)

(52) U.S. Cl.
CPC ....... *H10D 84/811* (2025.01); *H03K 17/6872* (2013.01); *H10D 84/83* (2025.01)

(58) Field of Classification Search
CPC .. H10D 84/811; H10D 84/83; H01L 27/0629; H01L 27/088; H01L 21/761; H01L 27/0922; H01L 21/823418; H01L 21/823462; H01L 27/0921; H03K 17/6872; H03K 2217/0018
See application file for complete search history.

(56) References Cited

U.S. PATENT DOCUMENTS

| | | |
|---|---|---|
| 6,424,013 B1 | 7/2002 | Steinhoff et al. |
| 9,019,670 B2 | 4/2015 | Steinhoff et al. |
| 2015/0048415 A1* | 2/2015 | Hung ............ H10D 89/713 438/133 |

OTHER PUBLICATIONS

International Searching Authority, Partial International Search, Jul. 24, 2023, 2 pages.
International Searching Authority, Written Opinion for PCT/US2023/017672, dated Sep. 15, 2023, 9 pages.
International Searching Authority, Search Report for PCT/US2023/017672, dated Sep. 15, 2023, 6 pages.

* cited by examiner

*Primary Examiner* — Jung Kim
(74) *Attorney, Agent, or Firm* — Frank D. Cimino (57) ABSTRACT

Biasing an isolation region in a semiconductor substrate. An integrated circuit includes a semiconductor substrate, a first rectifying device, and a second rectifying device. The semiconductor substrate has a first region, a second region, and a third region each being an opposite conductivity type from the semiconductor substrate. The first region and the second region are respective current terminals of a transistor. The first rectifying device has a first positive terminal and a first negative terminal. The first positive terminal is coupled to the first region, and the first negative terminal is coupled to the third region. The second rectifying device has a second positive terminal and a second negative terminal. The second positive terminal is coupled to a ground terminal, and the second negative terminal is coupled to the third region.

14 Claims, 10 Drawing Sheets

BIASING ISOLATION REGION IN SEMICONDUCTOR SUBSTRATE

CROSS-REFERENCE TO RELATED APPLICATIONS

This application claims priority to and the benefit of U.S. Provisional Patent Application Ser. No. 63/330,601, filed on Apr. 13, 2022, which is incorporated herein by reference in its entirety.

BACKGROUND

Charge may be injected into a semiconductor substrate of an integrated circuit during an operation of the circuit. The charge may be injected at regions within the semiconductor substrate. In some instances, the regions that receive the charge can have high-impedance, which may adversely affect the operation.

SUMMARY

This Summary is provided to introduce a brief selection of disclosed concepts in a simplified form that are further described below in the Detailed Description including the drawings provided. Various disclosed devices and methods may be beneficially applied to a semiconductor substrate that includes an isolation region and a P-N junction. While such embodiments may be expected to bias an isolation region in a manner that may reduce destructive snapback, no particular result is a requirement unless explicitly recited in a particular claim.

An example described herein is an integrated circuit. The integrated circuit includes a semiconductor substrate, a first rectifying device, and a second rectifying device. The semiconductor substrate has a first region, a second region, and a third region each being an opposite conductivity type from the semiconductor substrate. The first region and the second region are respective current terminals of a transistor. The first rectifying device has a first positive terminal and a first negative terminal. The first positive terminal is coupled to the first region, and the first negative terminal is coupled to the third region. The second rectifying device has a second positive terminal and a second negative terminal. The second positive terminal is coupled to a ground terminal, and the second negative terminal is coupled to the third region.

Another example is an integrated circuit. The integrated circuit includes a first transistor, a resistor, and a second transistor. The first transistor is coupled between a first power terminal and a second power terminal. The first transistor has a first control terminal. The resistor is coupled between the first power terminal and the first control terminal. The second transistor is coupled between the first control terminal and a ground terminal. The second transistor has a second control terminal coupled to the first power terminal.

The foregoing summary outlines rather broadly various features of examples of the present disclosure in order that the following detailed description may be better understood. Additional features and advantages of such examples will be described hereinafter. The described examples may be readily utilized as a basis for modifying or designing other examples that are within the scope of the appended claims.

The drawings, and accompanying detailed description, are provided for understanding of features of various examples and do not limit the scope of the appended claims. The examples illustrated in the drawings and described in the accompanying detailed description may be readily utilized as a basis for modifying or designing other examples that are within the scope of the appended claims. Identical reference numerals may be used, where possible, to designate identical elements that are common among drawings. The figures are drawn to clearly illustrate the relevant elements or features and are not necessarily drawn to scale.

DETAILED DESCRIPTION

Various features are described hereinafter with reference to the figures. An illustrated example may not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations. In the following discussion, doping levels may be described in quantitative and/or qualitative terms, wherein a doping level less than $1\times10^{16}$ cm$^{-3}$ is lightly doped, a doping level between $1\times10^{16}$ cm$^{-3}$ and $1\times10^{18}$ cm$^3$ is moderately doped, a doping level between $1\times10^{18}$ cm$^{-3}$ and $1\times10^{20}$ cm$^3$ is heavily doped, and a doping level above $1\times10^{20}$ cm$^{-3}$ is very heavily doped. A doping level at the boundaries of these ranges may be referred to qualitatively by either term referring to the higher or lower range.

The present disclosure relates to biasing an isolation region in a semiconductor substrate. Various examples include a bias circuit (or a bias selection circuit) that selectively electrically connects an isolation region to one of a ground terminal or a current terminal of a switch device for biasing. The isolation region may collect electrons that are injected in the semiconductor substrate. The current terminal may be, e.g., a drain region of a transistor that is the switch device. The drain region and the doping of the semiconductor substrate may form a P-N junction. Further, the drain region, the doping of the semiconductor substrate, and the isolation region may form a NPN parasitic bipolar junction transistor (BJT). The P-N junction and/or parasitic BJT may undergo avalanche in operation. The bias circuit is configured to selectively electrically connect the isolation region to a ground terminal (and bias the isolation region at a ground voltage) when the current terminal and the isolation region are at respective low voltages. The bias selection circuit is further configured to selectively electrically connect the isolation region to the current terminal when the current terminal is at a high voltage, thereby pulling up the voltage of the isolation region (and biasing the isolation region at that high voltage). The parasitic BJT and/or P-N junction may be in an avalanche condition when the current terminal is at a high voltage. By pulling up the voltage of the isolation region in such circumstances, the likelihood of snapback may be reduced. Snapback may be destructive to a device, since snapback may lead to excessive current, current crowding, and other destructive conditions. Other benefits and advantages may be achieved.

Figure 1:
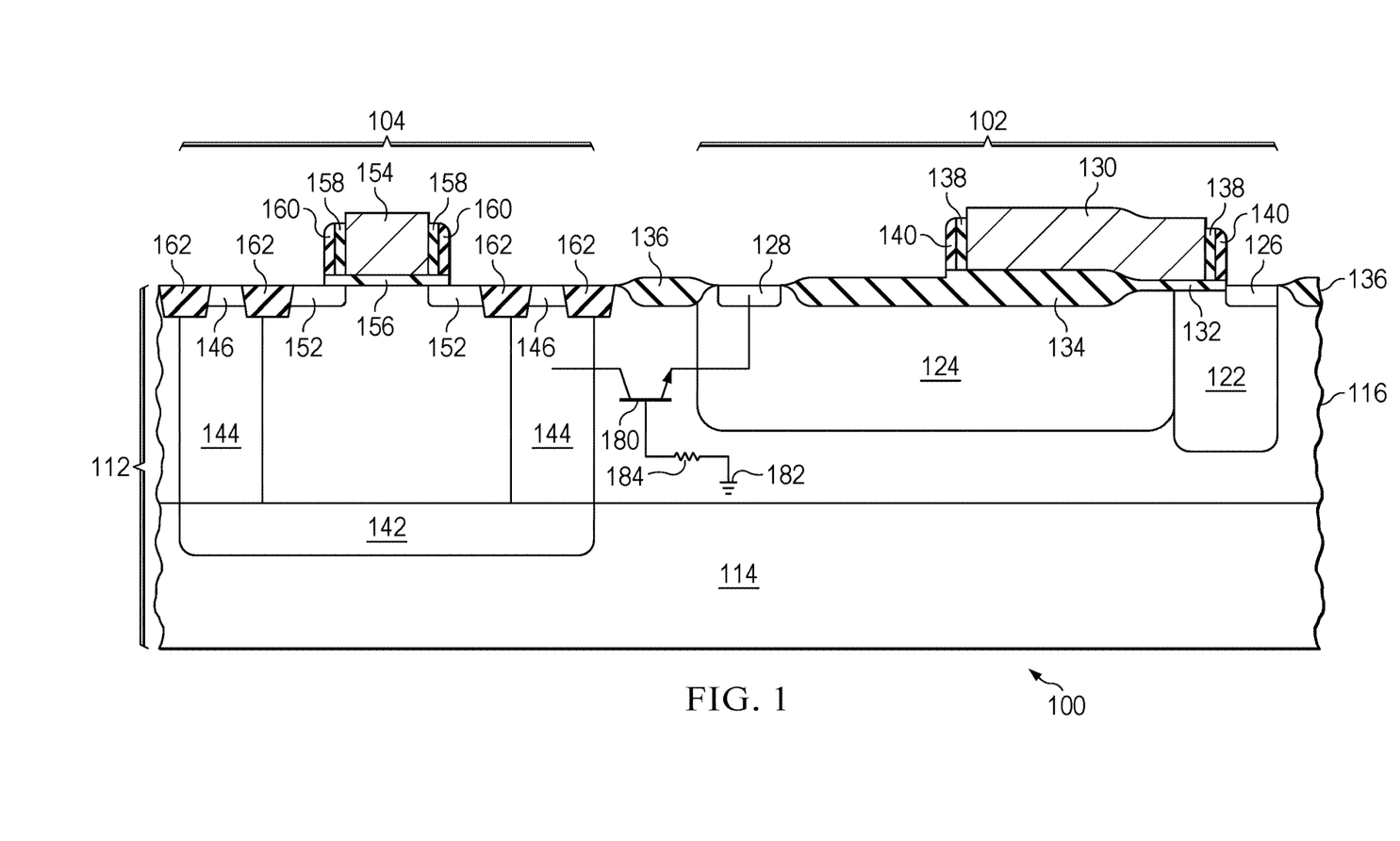
FIG. 1 is a schematic illustrating a cross-sectional view of a portion of an integrated circuit according to some examples.

FIG. 1 illustrates a cross-sectional view of a portion of an integrated circuit 100 according to some examples. The portion of the integrated circuit 100 includes a switch area 102 and an isolation area 104. As described in detail, a switch device (e.g., a transistor) may be in the switch area 102, and other devices (e.g., sensitive devices) may be in the isolation area 104. The cross-sectional view of FIG. 1 omits various components of the integrated circuit 100, such as a metal interconnect structure, for simplicity and so as to not obscure various aspects described herein.

The portion of the integrated circuit 100 includes a semiconductor substrate 112. The semiconductor substrate 112, in the illustrated example, includes a semiconductor support (or handle) substrate 114 (or handle wafer) and an epitaxial layer 116. The semiconductor support substrate 114 may be a bulk semiconductor substrate, a semiconductor-on-insulator (SOI) substrate, or any other appropriate substrate. The epitaxial layer 116 may be epitaxially grown on or over the semiconductor support substrate 114. The epitaxial layer 116 may be or include silicon (Si), silicon germanium (SiGe), gallium arsenide (GaAs), gallium nitride (GaN), the like, or a combination thereof. In some examples, the semiconductor support substrate 114 is or includes a silicon substrate (which may be singulated from a bulk silicon wafer at the conclusion of semiconductor processing), and the epitaxial layer 116 is or includes a layer of silicon. In some examples, the epitaxial layer 116 may be omitted, and a semiconductor material of the semiconductor substrate 112 (e.g., in or on which devices are formed) may be or include silicon (Si), silicon germanium (SiGe), gallium arsenide (GaAs), the like, or a combination thereof. The semiconductor substrate 112 has a top major surface in and/or on which devices (e.g., transistors) are formed.

The epitaxial layer 116 is doped with a dopant having a particular conductivity type. In some examples, the epitaxial layer 116 may be p-doped in situ with a p-type dopant (e.g., boron) at a concentration in a range from about $1 \times 10^{14}$ cm$^{-3}$ to about $5 \times 10^{15}$ cm$^{-3}$, e.g., lightly doped. In other examples, the semiconductor substrate 112 may be doped with a dopant in areas in which a device is to be formed. In such examples, the semiconductor substrate 112 may be p-doped with a p-type dopant at a concentration in a range from about $1 \times 10^{14}$ cm$^{-3}$ to about $5 \times 10^{15}$ cm$^{-3}$, e.g., lightly doped.

In the illustrated example, the switch device includes a laterally-diffused metal-oxide-semiconductor (LDMOS) transistor, and more specifically, for example, an n-channel LDMOS (nLDMOS) transistor. Other devices may be implemented as the switch device instead of or in addition to the LDMOS transistor in other examples. The LDMOS transistor includes a diffusion well (Dwell) 122, a drift well 124, a source region 126, a drain region 128, a gate electrode 130, a gate dielectric layer 132, and an isolation structure 134. The Dwell 122, drift well 124, source region 126, and drain region 128 are in the semiconductor substrate 112 (e.g., in the epitaxial layer 116). The gate dielectric layer 132 and isolation structure 134 are at the top major surface of the semiconductor substrate 112 (e.g., the top major surface of the epitaxial layer 116). The gate electrode 130 is over the gate dielectric layer 132 and a portion of the isolation structure 134. The Dwell 122, drift well 124, source region 126, and drain region 128 are laterally between isolation structures 136 at the top major surface of the semiconductor substrate 112.

The Dwell 122 extends from the top major surface of the semiconductor substrate 112 to a depth in the semiconductor substrate 112. The Dwell 122 is at least partially underlying the gate dielectric layer 132 that extends from the isolation structure 134. The Dwell 122 is doped with a dopant having a same conductivity type as the dopant with which the semiconductor substrate 112 is doped. In some examples, the Dwell 122 may be p-doped with a p-type dopant at a concentration in a range from about $1 \times 10^{18}$ cm$^{-3}$ to about $1 \times 10^{19}$ cm$^{-3}$, e.g., heavily doped.

The drift well 124 extends from the top major surface of the semiconductor substrate 112 into a depth in the semiconductor substrate 112. The drift well 124 is at least partially underlying the gate dielectric layer 132 and the isolation structure 134. The drift well 124, in the illustrated example, laterally adjoins the Dwell 122. The drift well 124 is doped with a dopant. The dopant with which the drift well 124 is doped has a conductivity type that is opposite of the dopant with which the Dwell 122 and semiconductor substrate 112 are doped. In some examples, the drift well 124 may be an n-well doped with an n-type dopant (e.g., phosphorous and/or arsenic) at a concentration in a range from about $1 \times 10^{16}$ cm$^{-3}$ to about $5 \times 10^{17}$ cm$^{-3}$, e.g., moderately doped.

The source region 126 is in the Dwell 122 extending from the top major surface of the semiconductor substrate 112 to a depth in the Dwell 122 in the semiconductor substrate 112. The drain region 128 is in the drift well 124 extending from the top major surface of the semiconductor substrate 112 to a depth in the drift well 124 in the semiconductor substrate 112. The isolation structure 134 and the gate dielectric layer 132 extending from the isolation structure 134 are laterally between the source region 126 and the drain region 128. The source region 126 and drain region 128 are doped with a dopant having an opposite conductivity type as the dopant with which the Dwell 122 and semiconductor substrate 112 are doped. In some examples, the source region 126 and drain region 128 may be n-doped with an n-type dopant at a concentration in a range from about $1 \times 10^{20}$ cm$^{-3}$ to about $3 \times 10^{21}$ cm$^{-3}$, e.g., very heavily doped.

The gate dielectric layer 132 may be or include any appropriate dielectric material, such as an oxide, nitride, the like, or a combination thereof. The isolation structures 134, 136 may be any appropriate isolation structure, and as illustrated, the isolation structures 134, 136 are field oxide (FOX) structures, such as local oxidation of silicon (LOCOS) structures. The gate electrode 130 may be or include any appropriate conductive material, such as polysilicon (e.g., doped polysilicon), metal (e.g., tungsten (W), aluminum (Al), titanium (Ti), tantalum (Ta), or the like), the like, or a combination thereof. Oxide layers 138 are along sidewall surfaces of the gate electrode 130, and spacers 140 are on the oxide layers 138 along sidewall surfaces of the gate electrode 130. The spacers 140 may be or include any appropriate dielectric material, such as an oxide, a nitride, the like, or a combination thereof.

In the isolation area 104, the semiconductor substrate 112 includes an isolation region that includes a buried layer 142, a deep well 144, and a surface region 146. In the illustrated example, the buried layer 142 is in the semiconductor support substrate 114 and extends from an interface between the semiconductor support substrate 114 and the epitaxial layer 116 to a depth in the semiconductor support substrate 114. The buried layer 142 is doped by a dopant that has a conductivity type that is opposite from the conductivity type of the dopant with which the semiconductor substrate 112 is doped. In some examples, the buried layer 142 may be an n-type layer doped with an n-type dopant at a concentration in a range from about $1\times10^{17}$ cm$^{-3}$ to about $8\times10^{18}$ cm$^{-3}$, e.g., moderately to heavily doped.

The deep well 144 extends from proximate the top major surface of the semiconductor substrate 112 to (and possibly, into) the buried layer 142. The deep well 144 is doped with a dopant that has a same conductivity type as the dopant with which the buried layer 142 is doped and an opposite conductivity type to the dopant with which the semiconductor substrate 112 is doped. In some examples, the deep well 144 may be an n-well doped with an n-type dopant at a concentration in a range from about $1\times10^{17}$ cm$^{-3}$ to about $2\times10^{20}$ cm$^{-3}$, e.g., moderately to heavily doped.

The surface region 146 is in the deep well 144 extending from the top major surface of the semiconductor substrate 112 to a depth in the deep well 144 in the semiconductor substrate 112. The surface region 146 is doped with a dopant having a same conductivity type as the dopant with which the deep well 144 is doped. In some examples, the surface region 146 may be n-doped with an n-type dopant at a concentration in a range from about $1\times10^{20}$ cm$^{-3}$ to about $3\times10^{21}$ cm$^{-3}$, e.g., very heavily doped.

The deep well 144 (and the surface region 146 therein) laterally surrounds or circumscribes an area of the semiconductor substrate 112 in the isolation area 104 in which devices are to be formed. The deep well 144 and buried layer 142 (e.g., the isolation region) form a doped tub in the semiconductor substrate 112 as a result of the deep well 144 laterally surrounding or circumscribing an area of the semiconductor substrate 112 and extending to the buried layer 142. The doped tub surrounds, both laterally and underlying, within the semiconductor substrate 112 the devices that are formed within the doped tub. The doped tub may provide junction isolation between devices formed in the semiconductor substrate 112 within the tub (e.g., laterally surrounded or circumscribed by the deep well 144) and devices formed in the semiconductor substrate 112 outside of the tub, such as the illustrated LDMOS transistor.

Any type of devices may be formed within the isolation region (comprising the deep well 144 and buried layer 142). An n-type metal-oxide-semiconductor (NMOS) transistor is illustrated in FIG. 1 as an example. Other devices may be formed in the isolation region, such as a p-type metal-oxide-semiconductor (PMOS) transistor, a diode, a BJT, a resistor, a capacitor, an inductor, etc. The NMOS transistor includes source/drain regions 152 in the semiconductor substrate 112 and a gate electrode 154 over the semiconductor substrate 112 laterally between the source/drain regions 152.

The source/drain regions 152 extend from the top major surface of the semiconductor substrate 112 to a depth in the semiconductor substrate 112. A gate dielectric layer 156 is laterally between the source/drain regions 152. The source/drain regions 152 are doped with a dopant having an opposite conductivity type as the dopant with which the semiconductor substrate 112 is doped. In some examples, the source/drain regions 152 may be n-doped with an n-type dopant at a concentration in a range from about $1\times10^{20}$ cm$^{-3}$ to about $3\times10^{21}$ cm$^{-3}$, e.g., very heavily doped.

The gate dielectric layer 156 may be or include any appropriate dielectric material, such as an oxide, nitride, the like, or a combination thereof. The gate electrode 154 is over the gate dielectric layer 156. The gate electrode 154 may be or include any appropriate conductive material, such as polysilicon (e.g., doped polysilicon), metal (e.g., tungsten (W), aluminum (Al), titanium (Ti), tantalum (Ta), or the like), the like, or a combination thereof. Oxide layers 158 are along sidewall surfaces of the gate electrode 154, and spacers 160 are on the oxide layers 158 along sidewall surfaces of the gate electrode 154. The spacers 160 may be or include any appropriate dielectric material, such as an oxide, a nitride, the like, or a combination thereof.

Isolation structures 162 may be at the top major surface of the semiconductor substrate 112 and extending into the semiconductor substrate 112. The isolation structures 162 may laterally separate a device or doped region of a device from another doped region, including the isolation region. The isolation structures 162 may be any appropriate isolation structure, and as illustrated, the isolation structures 162 are shallow trench isolation (STI) structures.

FIG. 1 also illustrates a circuit model representing parasitic devices in the semiconductor substrate 112 superimposed with the cross-sectional view. Specifically, a parasitic BJT 180 forms in the semiconductor substrate 112. The parasitic BJT 180 is formed by the drain region 128 and drift well 124, the semiconductor substrate 112 (e.g., the epitaxial layer 116), and the isolation region (e.g., the deep well 144 and/or the buried layer 142). In the examples in which the drain region 128, drift well 124, deep well 144, and buried layer 142 are doped with an n-type dopant, and the epitaxial layer 116 is doped with a p-type dopant, the parasitic BJT 180 may be an NPN BJT. In other examples in which the various layers and regions are doped differently, the parasitic BJT 180 may be a PNP BJT. For example, the semiconductor substrate 112 may be n-doped, and the drain region 128, drift well 124, deep well 144, and buried layer 142 may be p-doped.

In an operation of the integrated circuit, the drain region 128 and drift well 124 form the emitter of the parasitic BJT 180; the semiconductor substrate 112 forms the base of the parasitic BJT 180; and the isolation region forms the collector of the parasitic BJT 180. The base and emitter form one P-N junction, and the base and collector form another P-N junction. Although not shown in FIG. 1, the semiconductor substrate 112 (e.g., the epitaxial layer 116) may be grounded 182 through a substrate surface region (e.g., a highly p-doped region, in some examples) in the semiconductor substrate 112 (e.g., the epitaxial layer 116). Some resistance 184 may be between the formed base of the parasitic BJT 180 in the semiconductor substrate 112 and where the semiconductor substrate 112 is grounded 182.

In an operation of the integrated circuit 100, charge (e.g., electrons) may be injected into the semiconductor substrate 112, particularly if the switch device (e.g., the LDMOS transistor) is operated with a negative voltage. These charge may be collected by the isolation region (e.g., deep well 144 and buried layer 142). If the isolation region has a high impedance, a high voltage droop can develop at the isolation region, which can adversely affect the operation of the integrated circuit 100.

One way to reduce the voltage droop from the isolation region (and reducing the impedance of the isolation region) is electrically connecting the isolation region to a ground terminal. With such arrangements, the charge can be removed from the isolation region into the ground terminal. But if the isolation region is fixedly coupled to the ground terminal, when the integrated circuit 100 is operated at a high voltage (e.g., a high voltage is applied to the drain region 128), the P-N junction between the base and the collector can become reverse-biased, and a reverse current can flow from drain region 128 into the semiconductor substrate 112. The reverse current can be amplified by positive feedback, which can lead to avalanche.

Also, in avalanche, the emitter and collector of the parasitic BJT 180 swap, with the isolation region forming the emitter of the parasitic BJT 180 grounded. The reverse current can flow through the parasitic resistance 184 of semiconductor substrate 112 to ground and develop a voltage difference ($V_{BE}$) between the base (e.g., the semiconductor substrate 112) and emitter (e.g., the isolation region). As the reverse current increases due to avalanche, $V_{BE}$ may further increase and turn on the parasitic BJT 180. The emitter can inject electrons into the base by diffusion, which can get swept to the collector by drift, and a current can flow through the parasitic BJT 180. This leads to a snapback phenomena that could be destructive to the integrated circuit 100. The current through the parasitic BJT 180 can further increase as more electron-hole pairs are generated in the BJT via emitted electrons. Snapback may cause current crowding and excessive current in regions of the semiconductor substrate 112, which may be destructive.

Another way to remove the charge from the isolation region is electrically connecting the isolation region to a positive power supply (e.g., $V_{DD}$) terminal, so that the charge may flow to the positive supply terminal. But connecting the isolation region to the positive power supply terminal may also adversely affect the operation of the integrated circuit 100. For example, in some implementations, the power supply coupled to the positive voltage supply terminal may be weak (e.g., provides a very low current) or may be unavailable at the time at which avalanche occurs. Also, the flow of charge from the isolation region to the positive voltage supply terminal could adversely affect the voltage being provided at the positive voltage supply terminal, and other circuits that receive a power supply voltage from the positive voltage supply terminal. For example, in a case where the switch device has a negative voltage at drain region 128, the parasitic BJT 180 can be enabled due to a positive $V_{BE}$ voltage between the base (the semiconductor substrate 112) and the emitter (the drain region 128), with the isolation region forming the collector of the BJT. With the isolation region also coupled to the positive voltage supply terminal, current can flow from the positive voltage supply terminal through the isolation region and the BJT to drain region 128, which can pull down the power supply voltage if the power supply is weak.

In some examples, an integrated circuit can include a bias circuit (or a bias picker circuit) to selectively connect an isolation region in a semiconductor substrate to different bias sources under different operation conditions. In some examples, the bias circuit may be an analog diode-OR circuit, as detailed subsequently. The bias circuit is configured to connect an isolation region to a ground terminal to bias the isolation region at the ground voltage when a switch terminal is at a low voltage (e.g., due to the switch being turned on). The bias circuit is also configured to connect the isolation region to the switch terminal to bias the isolation region at a voltage that tracks the switch terminal's voltage when the switch terminal is at a high voltage (e.g., during avalanche when the switch is turned off). By connecting the isolation region to the switch terminal during avalanche, the isolation region may be biased at an increased voltage, which responsively reduces the voltage difference ($V_{BE}$) between the base and emitter of the parasitic BJT 180. The reduced voltage difference ($V_{BE}$) may reduce the likelihood of snapback occurring. Such arrangements also reduce the need for connecting the isolation region to a positive voltage source terminal, which can reduce the adverse impacts that might otherwise occur due to a weak power source, particularly when the switch terminal is at a low voltage.

Figure 2:
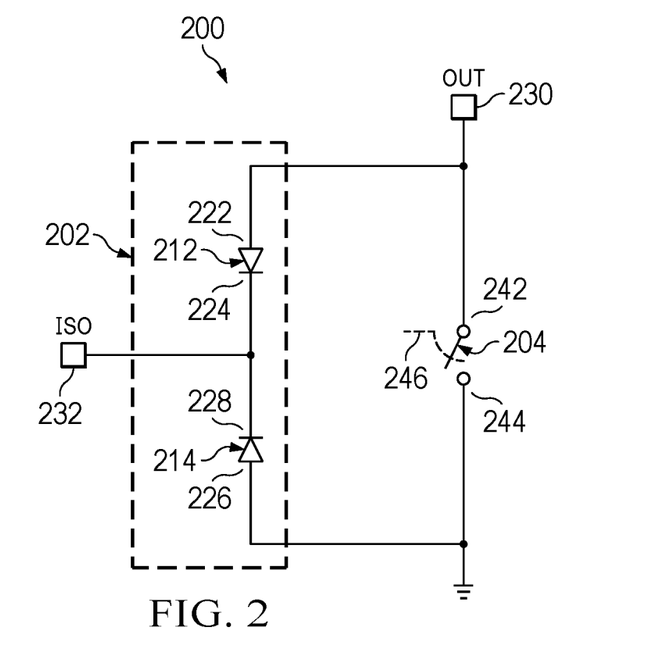
FIG. 2 is a schematic illustrating an isolation region bias circuit and a switch device according to some examples.

FIG. 2 illustrates an integrated circuit 200 comprising a bias circuit 202 and a switch device 204 according to some examples. The bias circuit 202 may include an analog diode-OR circuit in some examples.

The bias circuit 202 includes a first rectifying device 212 and a second rectifying device 214. The rectifying devices 212, 214 may each include a P-N junction diode, a metal junction diode (e.g., a Schottky diode), a diode-connected transistor, a circuit that emulates a diode, the like, or a combination thereof. In the illustrated example, the rectifying devices 212, 214 are shown to be respective P-N junction diodes. According to some examples, the second rectifying device 214 has a low forward voltage, such as less than 0.1 V, and in some examples, approximately 50 mV. The forward voltage of the second rectifying device 214 may be lower than the forward voltage of the first rectifying device 212.

The first rectifying device 212 has a positive terminal (anode) 222 and a negative terminal (cathode) 224, and the second rectifying device 214 has a positive terminal (anode) 226 and a negative terminal (cathode) 228. As described above, the forward voltage of the second rectifying device 214 may be lower than the forward voltage of the first rectifying device 212. Accordingly, the first rectifying device 212 is enabled and can conduct a forward current from the positive terminal 222 and the negative terminal 224 if a first voltage difference between the positive terminal 222 and the negative terminal 224 exceeds a first forward voltage. Also, the second rectifying device 214 is enabled and can conduct a forward current from the positive terminal 226 to the negative terminal 228, if a second voltage difference between the positive terminal 226 and the negative terminal 228 exceeds a second forward voltage, where the second forward voltage is lower than the first forward voltage. The positive terminal 222 of the first rectifying device 212 is coupled to an output (OUT) terminal 230, which is coupled to a current terminal of the switch device 204, and the negative terminal 224 of the first rectifying device 212 is coupled to an isolation (ISO) terminal 232. The positive terminal 226 of the second rectifying device 214 is coupled to a ground terminal, and the negative terminal 228 of the second rectifying device 214 is coupled to the ISO terminal 232.

As an example, when the first rectifying device 212 is a diode, an anode of the diode may be coupled to the positive terminal 222, and a cathode of the diode may be coupled to the negative terminal 224. Similarly, when the first rectifying device 212 is a diode-connected transistor, an effective anode of the diode-connected transistor may be coupled to the positive terminal 222, and an effective cathode of the diode-connected diode may be coupled to the negative terminal 224. Other devices implemented for the first rectifying device 212 may be similarly coupled.

As an example when the second rectifying device 214 is a diode (e.g., including a Schottky diode), an anode of the diode may be coupled to the positive terminal 226, and a cathode of the diode may be coupled to the negative terminal 228. Similarly, when the second rectifying device 214 is a diode-connected transistor, an effective anode of the diode-connected transistor (coupled to the gate/base and one of the current terminals of the transistor) may be coupled to the positive terminal 226, and an effective cathode of the diode-connected diode may be coupled to the negative terminal 228. A diode emulation circuit and/or other devices implemented for the second rectifying device 214 may be similarly coupled.

The switch device 204 may include any device controllable to be in a closed (e.g., conducting) state or an open (e.g., non-conducting) state. The switch device 204 may include a metal-oxide-semiconductor (MOS) transistor, such as, for example, an LDMOS transistor. The switch device 204 has a first current terminal 242, a second current terminal 244, and a control terminal 246. The control terminal 246 may control, at least in part, when the switch device 204 is in a closed state or an open state between the first current terminal 242 and the second current terminal 244. When the switch device 204 is an n-type transistor (e.g., n-type LDMOS transistor), the first current terminal 242 may be a drain region; the second current terminal 244 may be a source region; and the control terminal 246 may be a gate electrode.

Figure 3:
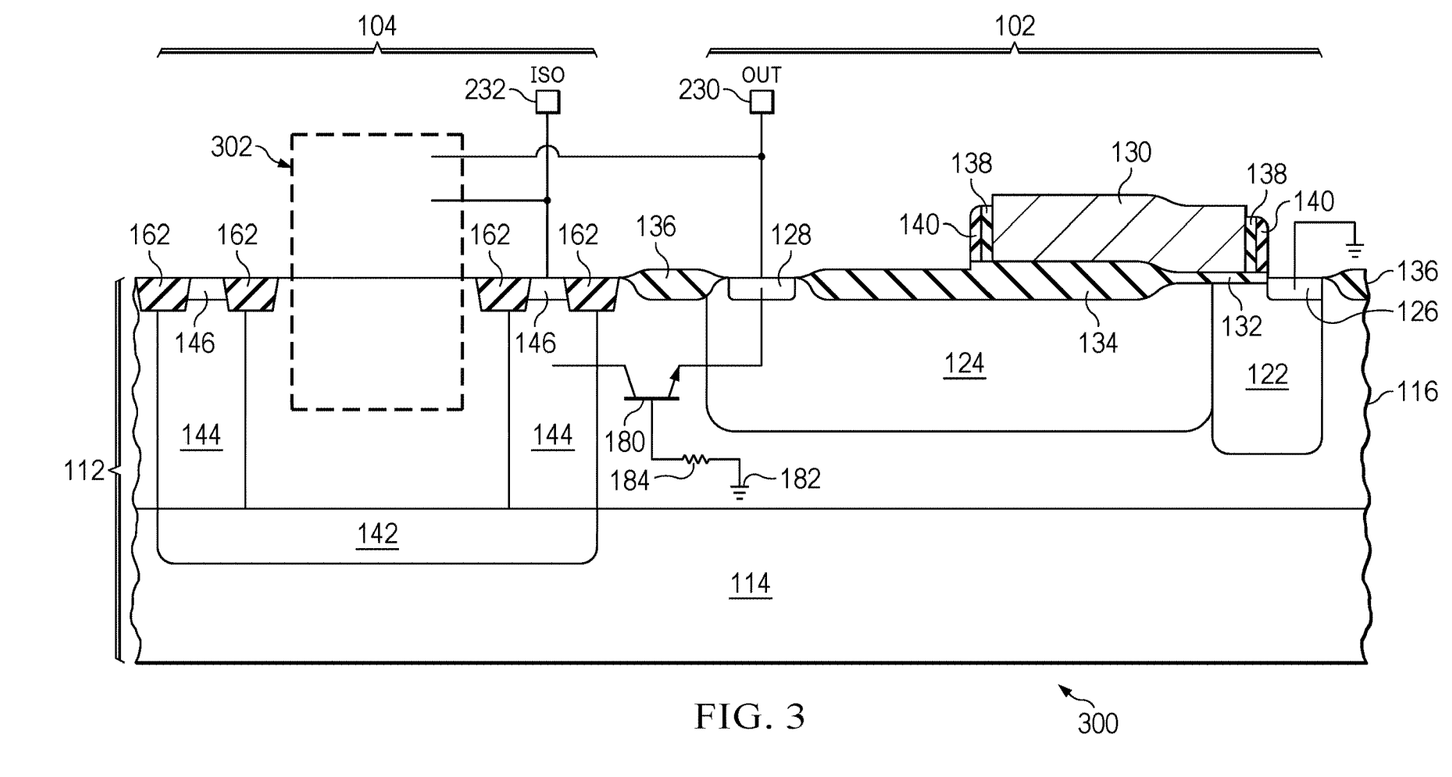
FIG. 3 is a schematic illustrating a cross-sectional view of a portion of an integrated circuit that includes an isolation region bias circuit and a switch device according to some examples.

FIG. 3 illustrates a cross-sectional view of a portion of an integrated circuit 300 that includes a bias circuit and a switch device according to some examples. In FIG. 3, the switch device is an LDMOS transistor in a switch area 102, like illustrated in and described with respect to FIG. 1. The integrated circuit 300 also includes an isolation region including the deep well 144 and buried layer 142 in an isolation area 104. The rectifying devices 212, 214 of the bias circuit 202 can be in a bias circuit area 302 in the isolation area 104.

For example, in a case where a rectifying device 212, 214 includes a diode, the diode may include a p-doped region and an n-doped region in the semiconductor substrate 112, where the p-doped region and n-doped region form a P-N junction. Where a rectifying device 212, 214 includes a metal junction diode (e.g., Schottky diode), the metal junction diode may include a doped region in the semiconductor substrate 112 with a metal or metal-semiconductor compound interfacing with the doped region. In a case where a rectifying device 212, 214 includes a diode-connected transistor, the diode-connected transistor may include source/drain regions in the semiconductor substrate 112 with a gate electrode over the semiconductor substrate 112. The gate electrode may be coupled to one of the source/drain regions through metal contacts and/or metal lines in a metal interconnect structure over the semiconductor substrate 112. Where a rectifying device 212, 214 includes a diode emulation circuit, various doped regions may be in the semiconductor substrate 112 with various gate electrodes being over the semiconductor substrate 112. Any device(s) of the rectifying devices 212, 214, or portion(s) thereof, may be in the semiconductor substrate 112 surrounded by the isolation region (e.g., laterally surrounded by the deep well 144 and over the buried layer 142).

In the illustrated example of FIG. 3, the drain region 128 is the first current terminal 242 that is coupled to the OUT terminal 230, and the source region 126 is the second current terminal 244 that is coupled to a ground terminal. The ISO terminal 232 is coupled to the isolation region through the surface region 146. The OUT terminal 230 and the ISO terminal 232 are coupled to the rectifying devices 212, 214 in the bias circuit area 302 within the isolation region. FIG. 3 illustrates the parasitic BJT 180 formed by (i) the drain region 128 and drift well 124, (ii) the semiconductor substrate 112, and (iii) the isolation region.

Figure 4A:
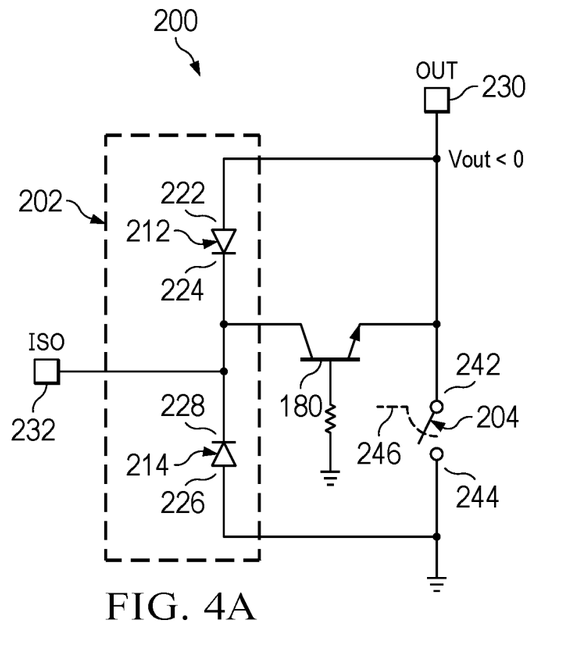
FIGS. 4A and 4B are schematics illustrating aspects of operations of the isolation region bias circuit and switch device of FIGS. 2 and 3 according to some examples.
Figure 4B:
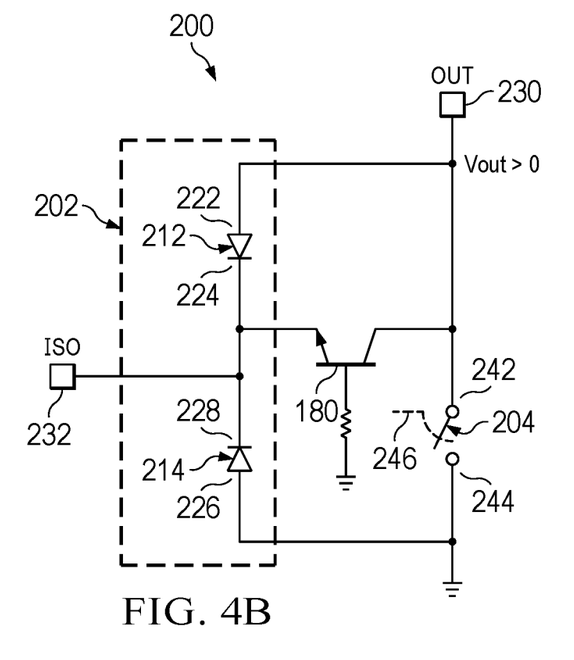

FIGS. 4A and 4B illustrate aspects of operation of the integrated circuit 200 that includes the bias circuit 202 in the bias circuit area 302 and switch device 204 in the switch area 102 as in FIG. 3. In an operation condition where the voltage (Vout) of the OUT terminal 230 is negative, the first current terminal 242 (e.g., the drain region 128) can be the effective emitter and the isolation region (e.g., the deep well 144 and buried layer 142) can be the collector. The P-N junction between the base of the parasitic BJT 180 (the semiconductor substrate 112) and the emitter (drain region 128) can be forward biased. The isolation region collects charge through the parasitic BJT 180. In such an operation condition, the difference between Vout and the voltage (Viso) of the ISO terminal 232 (coupled to the negative terminal 224 of the first rectifying device 212) is below the forward voltage of the first rectifying device 212. The first rectifying device 212 can be reverse-biased/disabled and disconnect the ISO terminal 232 from the OUT terminal 230. Also, the ground (coupled to the positive terminal 226 of the second rectifying device 214) voltage exceeds the voltage (Viso) of the ISO terminal 232 (coupled to the negative terminal 228 of the second rectifying device 214) by more than the forward voltage of the second rectifying device 214, and the second rectifying device 214 can be forward-biased. Accordingly, charge collected at the isolation region can flow through the second rectifying device 214 to the ground terminal (e.g., a positive current can flow from the ground to the ISO terminal 232 through the forward-biased second rectifying device 214 to remove the electrons).

When the voltage (Vout) of the OUT terminal 230 is high, the P-N junction between the base of the parasitic BJT 180 (semiconductor substrate 112) and the drain region 128 can be reverse-biased, a reverse current can flow into the semiconductor substrate 112, and avalanche may occur as the reverse current increases due to positive feedback. As discussed above, if the Viso of the ISO terminal 232 remains low, the ISO terminal 232 can become an emitter of the parasitic BJT 180, and as the voltage of the semiconductor substrate 112 (the base) increases due to the increasing reverse current, a high $V_{BE}$ may result, which may cause the snapback event. But in the example of FIG. 4B, the high Vout causes the first rectifying device 212 to be forward biased and pulls the Viso of the ISO terminal 232 up (e.g., to Vout−Vf, where Vf is the forward voltage of the first rectifying device 212). Increasing the Viso can reduce $V_{BE}$ between the base (e.g., the semiconductor substrate 112) and emitter (e.g., the isolation region), which may reduce the likelihood of snapback. Also, the second rectifying device 214 can become reverse-biased and disconnect the ISO terminal 232 from the ground terminal.

Figure 5:
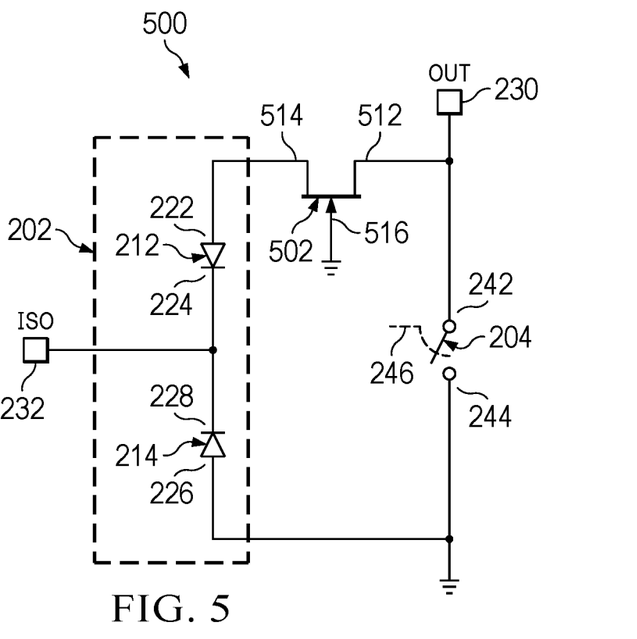
FIG. 5 is a schematic illustrating an isolation region bias circuit, a switch device, and a cascode device according to some examples.

FIG. 5 illustrates an integrated circuit 500 that includes a bias circuit 202, a switch device 204, and a cascode device 502 according to some examples. The bias circuit 202 and switch device 204 are as described previously with respect to FIG. 2. The cascode device 502 may be any device that clamps a voltage to a desired voltage. In the illustrated example, the cascode device 502 is shown to be a junction field effect transistor (JFET). The cascode device 502 includes a first current terminal 512 (e.g., a drain region), a second current terminal 514 (e.g., a source region), and a control terminal 516 (e.g., a gate electrode). The first current terminal 512 of the cascode device 502 is coupled to the OUT terminal 230, and the second current terminal 514 of the cascode device 502 is coupled to the positive terminal 222 of the first rectifying device 212. In this example, the positive terminal 222 of the first rectifying device 212 is coupled to the OUT terminal 230 through the cascode device 502. The control terminal 516 of the cascode device 502 is coupled to a ground terminal. The cascode device 502 may cause the lower of the voltage (Vout) on the OUT terminal 230 and a clamping voltage, such as 7 V, 12 V, or the like, to be applied to the second current terminal 514 of the cascode device 502, and hence, to the positive terminal of the first rectifying device 212. The cascode device 502 may be in the bias circuit area 302 within the isolation region as shown in FIG. 3.

Figure 6A:
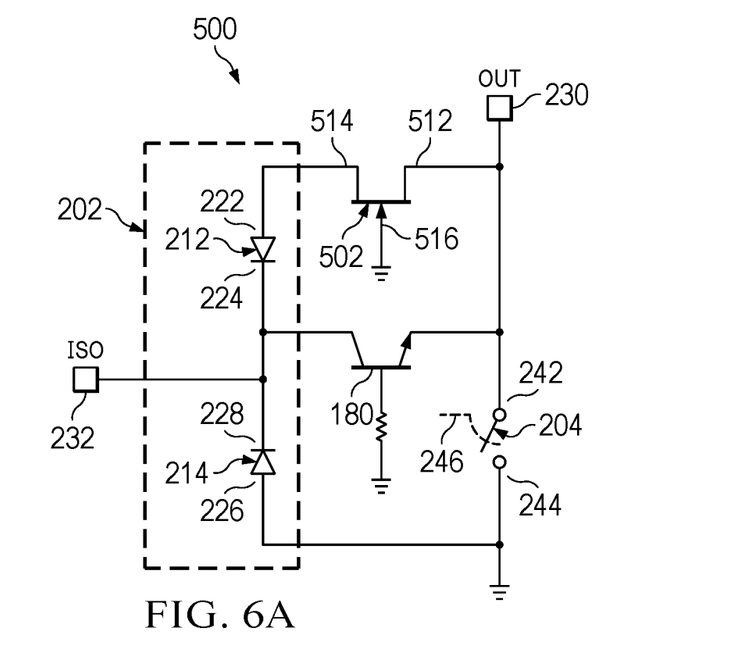
FIGS. 6A and 6B are schematics illustrating aspects of operations of the isolation region bias circuit, switch device, and cascode device of FIG. 5 according to some examples.
Figure 6B:
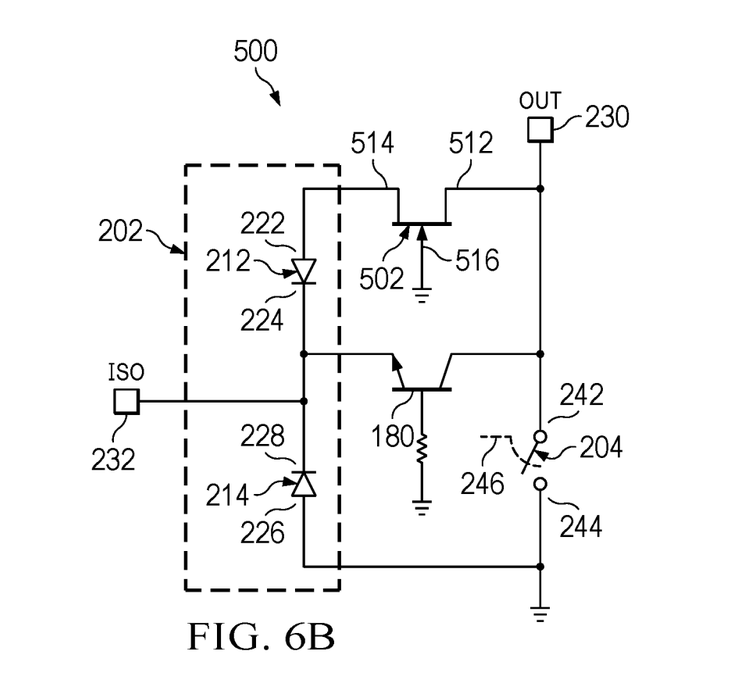

FIGS. 6A and 6B illustrate aspects of operation of the integrated circuit 500 that includes the bias circuit 202 and cascode device 502 in the bias circuit area 302 and the switch device 204 in the switch area 102 fabricated like in FIG. 3. When the voltage (Vout) of the OUT terminal 230 is negative, operation occurs in FIG. 6A like described with respect to FIG. 4A. When Vout of the OUT terminal 230 is high (such as greater than the forward voltage of the first rectifying device 212), operation occurs in FIG. 6B like described with respect to FIG. 4B, except that the voltage at the positive terminal 222 of the first rectifying device 212 may be clamped to a clamping voltage when the voltage (Vout) exceeds the clamping voltage. This may add some protection to the bias circuit 202 for high voltage (e.g., 700 V) applications.

Figure 7:
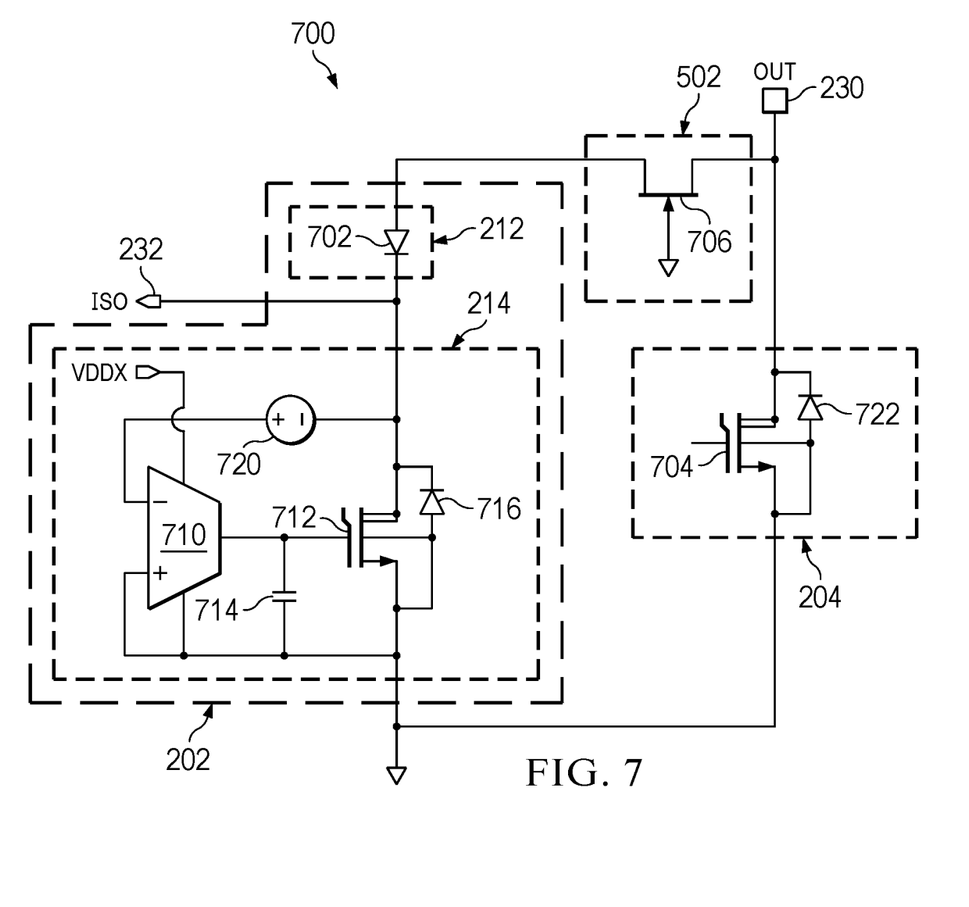
FIG. 7 is a schematic of an isolation region bias circuit, a switch device, and a cascode device according to some examples.

FIG. 7 is a circuit schematic of a specific implementation an integrated circuit 700 including a bias circuit 202, a switch device 204, and a cascode device 502 according to some examples. Specific terminals are not identified in FIG. 7 but are identifiable with reference to FIGS. 2 and 5. In the illustrated example, the first rectifying device 212 is a diode 702, and the second rectifying device 214 is a diode emulation circuit. The switch device 204 includes an LDMOS transistor 704, and the cascode device 502 is a JFET 706. The cascode device 502 may be omitted, such as indicated by FIG. 2.

As illustrated, a drain terminal of the JFET 706 is coupled to the OUT terminal 230, and a source terminal of the JFET 706 is coupled to an anode of the diode 702. A gate terminal of the JFET 706 is coupled to a ground terminal. A cathode of the diode 702 is coupled to the ISO terminal 232.

The diode emulation circuit includes an operational transconductance amplifier (OTA) 710 and an LDMOS transistor 712. Another type of amplifier may be implemented instead of or in addition to the OTA 710, and another type of transistor may be implemented instead of or in addition to the LDMOS transistor 712. Also, as illustrated, the diode emulation circuit includes a capacitor 714 and a body diode 716, one or both of which may be omitted in other examples. A negative input terminal of the OTA 710 is coupled to the ISO terminal 232. A voltage source 720 is illustrated as being coupled between the negative input terminal of the OTA 710 and the ISO terminal 232; however, the voltage source 720 may represent the forward voltage (Vota) of the diode emulated by the diode emulation circuit, and can be implemented by, for example, a voltage offset between the inputs of OTA 710. A positive input terminal of the OTA 710 is coupled to a ground terminal. Power terminals of the OTA 710 are coupled between a positive power supply (VDDX) terminal and the ground terminal. An output terminal of the OTA 710 is coupled to a first terminal of the capacitor 714 and a control terminal (e.g., the gate electrode) of the LDMOS transistor 712. A second terminal of the capacitor 714 is coupled to the ground terminal. A first current terminal (e.g., a drain region) of the LDMOS transistor 712 is coupled to the ISO terminal 232, and a second current terminal (e.g., a source region) of the LDMOS transistor 712 is coupled to the ground terminal. The body diode 716 has an anode coupled to the second current terminal and a body terminal of the LDMOS transistor 712 and has a cathode coupled to the first current terminal of the LDMOS transistor 712. The body diode 716 may be formed integral with the LDMOS transistor 712 in some examples.

Referring to the switch device 204, a drain terminal of the LDMOS transistor 704 is coupled to the OUT terminal 230, and a source terminal of the LDMOS transistor 704 is coupled to the ground terminal. The switch device 204 may also include a body diode 722. The body diode 722 has an anode coupled to the source terminal and a body terminal of the LDMOS transistor 704 and has a cathode coupled to the drain terminal of the LDMOS transistor 704. The body diode 722 may be formed integral with the LDMOS transistor 704 in some examples.

In operation, at low voltage, the ISO terminal 232 may collect charge (e.g., electrons). When the voltage (Viso) of the ISO terminal 232 plus the Vota is less than the voltage of the ground terminal (e.g., −0 V), the OTA 710 can charge the capacitor 714 and increase the gate terminal voltage of the LDMOS transistor 712 to a high voltage. The LDMOS transistor 712 can be enabled, so that the transistor is in a conducting state. In this conducting state, electrons from the ISO terminal 232 can flow through the LDMOS transistor 712 to the ground terminal, which emulates the forward conduction of the diode. In some examples, the Vota may be less than 0.1 V, such as 50 mV. Hence, in an example where Vota=50 mV, when Viso≤−50 mV, the LDMOS transistor 712 is in a conducting state, and electrons are collected to the ground terminal.

When the voltage (Vout) of the OUT terminal 230 or the voltage applied to the anode of the diode 702 is high, the voltage difference between the anode and the cathode of the diode 702 exceeds the forward voltage of the diode 702, the diode 702 is forward biased and pulls the voltage (Viso) of the ISO terminal 232 up. Also, the OTA 710 can discharge the capacitor 714 to decrease the gate terminal voltage of the LDMOS transistor 712 to a low voltage, and the LDMOS transistor 712 can be disabled. The body diode 716 can be reverse-biased and disconnect the ISO terminal 232 from the ground terminal. Hence, the ISO terminal 232 is electrically connected to the source terminal of the JFET 706, which will be the lower of the OUT terminal 230 and the clamping voltage in such circumstance. Accordingly, when a parasitic BJT is in avalanche while Vout is high, the ISO terminal 232 may be pulled up to a higher voltage, which may reduce the voltage difference ($V_{BE}$) between the base and emitter of the parasitic BJT thereby reducing the likelihood of the occurrence of a destructive snapback.

Figure 8:
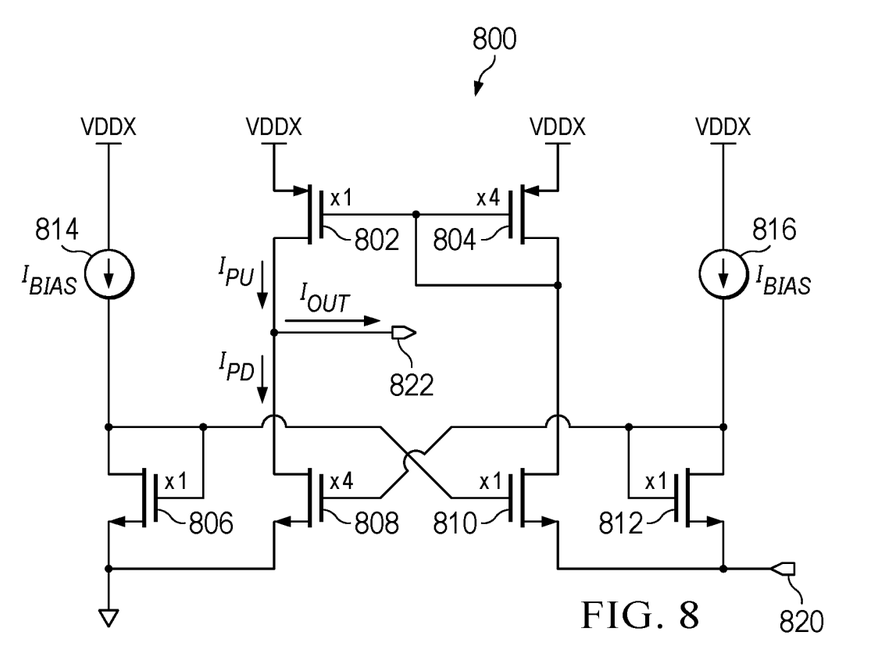
FIG. 8 is a schematic of an example operational transconductance amplifier (OTA) that can be part of the isolation region bias circuit of FIG. 7 according to some examples.

FIG. 8 is a circuit schematic of an example OTA 800 according to some examples. The OTA 800 may be implemented as the OTA 710 in FIG. 7, although another OTA may be implemented as the OTA 710 in other examples. The OTA 800 includes PMOS transistors 802, 804 and NMOS transistors 806, 808, 810, 812. The OTA 800 also includes bias current sources 814, 816. OTA 800 also includes input 820 and output 830. Input 820 can represent the negative input of OTA 710 in FIG. 7, and output 830 can represent the output of OTA 710 in FIG. 7.

The OTA 800 includes cross-coupled common-gate stages. In a common-gate stage, the bias current source 814 is coupled to a drain terminal of the NMOS transistor 806, a gate terminal of the NMOS transistor 806, and a gate terminal of the NMOS transistor 810. A source terminal of the NMOS transistor 806 is coupled to a ground terminal, and the source terminal of the NMOS transistor 806 represents a positive input of the OTA 800. A source terminal of the PMOS transistor 804 is coupled to a given positive power supply (VDDX) terminal, and a drain terminal and a gate terminal of the PMOS transistor 804 are coupled together and to a drain terminal of the NMOS transistor 810. A source terminal of the NMOS transistor 810 is coupled to input 820, which represents a negative input of OTA 800.

In another common-gate stages, the bias current source 816 is coupled to a drain terminal of the NMOS transistor 812, a gate terminal of the NMOS transistor 812, and a gate terminal of the NMOS transistor 808. A source terminal of the NMOS transistor 812 is coupled to the input 820. A source terminal of the PMOS transistor 802 is coupled to a given positive power supply (VDDX) terminal, and a drain terminal of the PMOS transistor 802 is coupled to a drain terminal of the NMOS transistor 808. The drain terminals of the PMOS transistor 802 and NMOS transistor 808 are coupled to the output 822 of the OTA 800. A source terminal of the NMOS transistor 808 is coupled to the ground terminal, and the source terminal of the NMOS transistor 808 can represent (or is coupled to) the positive input of the OTA 800. The gate terminal of the PMOS transistor 802 is coupled to the gate terminal of the PMOS transistor 804.

FIG. 8 shows the relative width-to-length ratios ($\alpha$) relative to a baseline width-to-length ratio ($W_0/L_0$). For a given transistor, the width-to-length ratio for that transistor is ($W/L = \alpha W_0/L_0$). The relative width-to-length ratios ($\alpha$) for the PMOS transistor 804 and the NMOS transistor 808 are four, while the relative width-to-length ratios ($\alpha$) for the PMOS transistor 802 and NMOS transistors 806, 810, 812 are one. This configuration introduces a voltage offset between the inputs of the OTA 800 representing the voltage source 720 of FIG. 7, which provides a forward voltage Vota of, for example, 50 mV for the diode emulated by the diode emulation circuit.

FIG. 8 also shows a pull-up current ($I_{PU}$), a pull-down current ($I_{PD}$), and an output current ($I_{OUT}$). The pull-up current ($I_{PU}$) flows from the PMOS transistor 802 to the output terminal. The pull-down current ($I_{PD}$) flows from the output terminal through the NMOS transistor 808. The output current ($I_{OUT}$) flows out of the OTA 800 at the output 822 and is a difference between $I_{PU}$ and $I_{PD}$, which depends on a voltage difference between input 820 and the ground voltage. Accordingly, based on the voltage difference, OTA 800 can provide either a net pull-up current (to charge the capacitor 714) or a net pull-down current (to discharge the capacitor 714) to set the conductive state of the LDMOS transistor 712.

Figure 9:
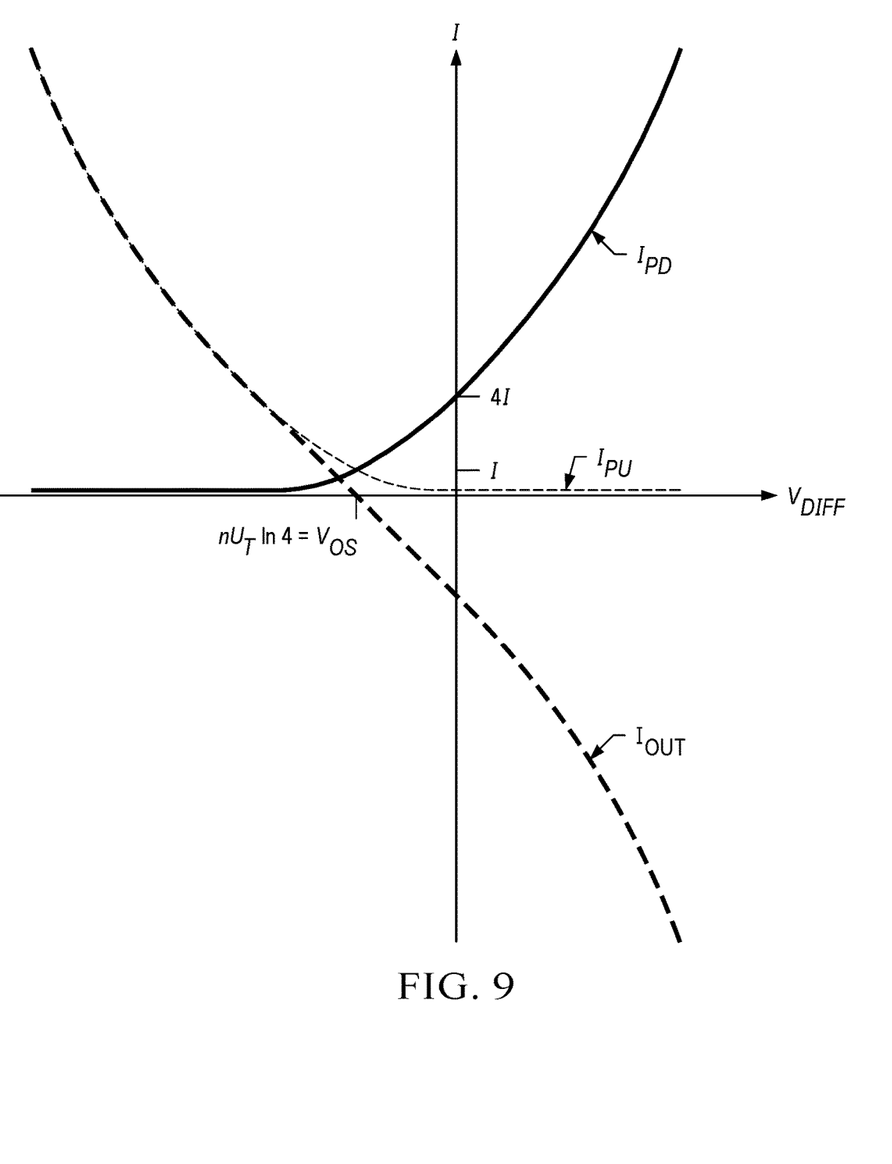
FIG. 9 is a graph illustrating example current curves of a pull-up current, a pull-down current, and an output current the OTA of FIG. 8 according to some examples.

FIG. 9 is a graph illustrating example current curves of the pull-up current ($I_{PU}$), pull-down current ($I_{PD}$), and output current ($I_{OUT}$) as a function of the voltage difference between the positive and negative inputs of the OTA 800. The point at which the current curves of the pull-up current ($I_{PU}$) and pull-down current ($I_{PD}$) cross indicate the Vota of the OTA 800.

Figure 10:
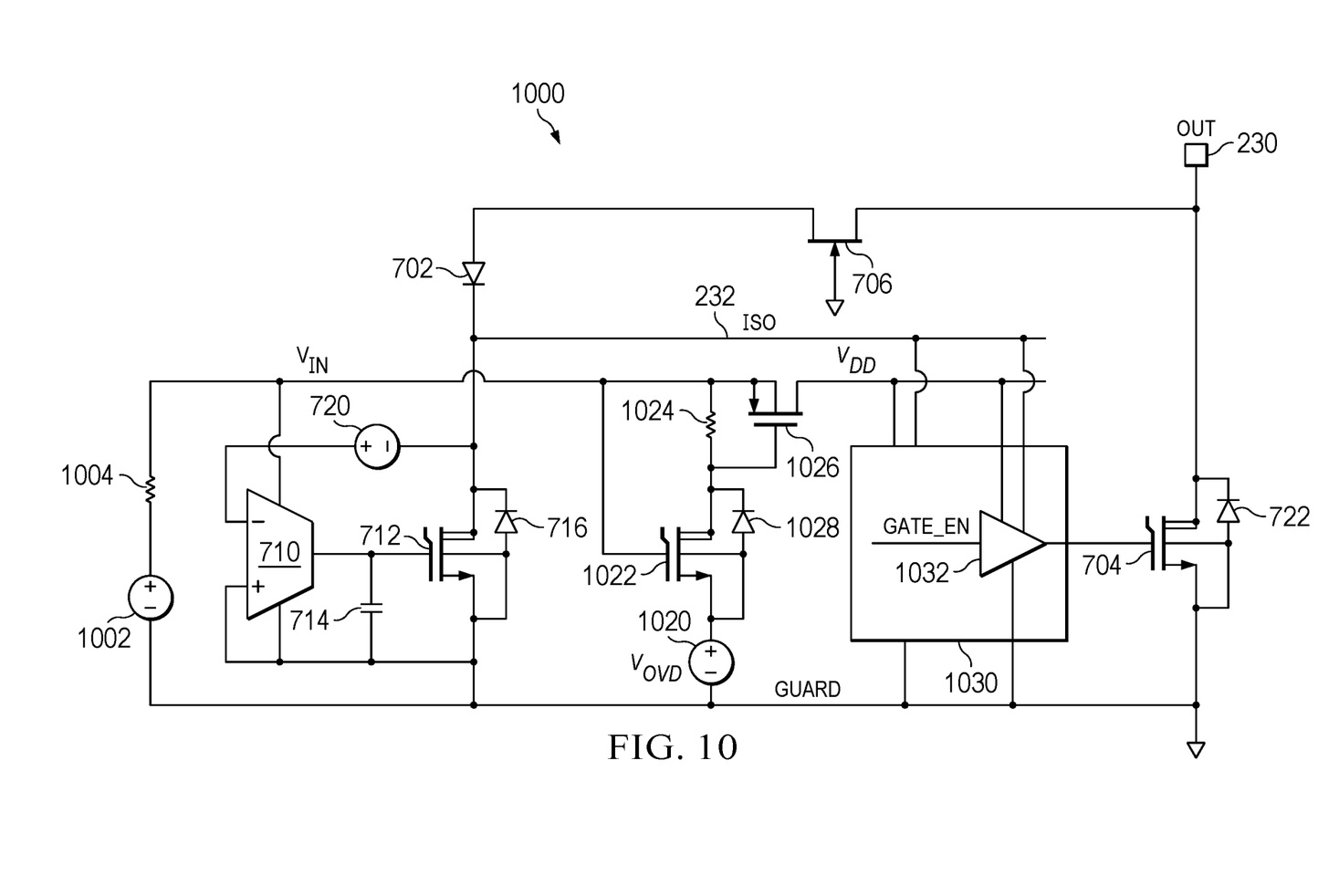
FIG. 10 is a schematic of a system including the isolation region bias circuit, the switch device, and the cascode device of FIG. 7 according to some examples.

FIG. 10 is a circuit schematic of a system 1000 incorporating the integrated circuit 700 of FIG. 7 according to some examples. The system 1000 includes the same circuit components as described with respect to FIG. 7, and to avoid repetition and obscuring other features, description of such components is omitted here.

The system 1000 includes a power source including a voltage source 1002 and a resistor 1004. The voltage source 1002 is shown as a direct current (DC) voltage source. The resistor 1004 represents a resistance in the power source, and may represent any impedance in the power source. Any power source may be implemented. A negative terminal of the voltage source 1002 is coupled to a ground terminal. A positive terminal of the voltage source 1002 is coupled to a first terminal of the resistor 1004. A second terminal of the resistor 1004 (opposite from the first terminal) is a power supply input voltage ($V_{IN}$) terminal. The positive supply terminal of the OTA 710 is coupled to the $V_{IN}$ terminal.

The system 1000 includes a guard circuit. The guard circuit includes a voltage source 1020, an LDMOS transistor 1022, a resistor 1024, a PMOS transistor 1026, and a diode 1028. The voltage source 1020 has a negative terminal coupled to the ground terminal and has a positive terminal coupled to a source terminal of the LDMOS transistor 1022. The voltage source 1020, in some examples, may not be an explicit voltage source but may be one or more devices coupled to provide a particular voltage drop. A drain terminal of the LDMOS transistor 1022 is coupled to a gate terminal of the PMOS transistor 1026 and a first terminal of the resistor 1024. A gate terminal of the LDMOS transistor 1022 is coupled to the $V_{IN}$ terminal. A second terminal (opposite from the first terminal) of the resistor 1024 is coupled to the $V_{IN}$ terminal. A source terminal and a bulk terminal of the PMOS transistor 1026 is coupled to the $V_{IN}$ terminal, and a drain terminal of the PMOS transistor 1026 is coupled to a positive power supply ($V_{DD}$) terminal. The body diode 1028 has an anode coupled to the source terminal and a body terminal of the LDMOS transistor 1022 and has a cathode coupled to the drain terminal of the LDMOS transistor 1022. The diode 1028 may be formed integral with the LDMOS transistor 1022 (e.g., being a body diode of the LDMOS transistor 1022) in some examples.

In operation, before the power source brings the voltage on the $V_{IN}$ terminal up to an operating voltage, the LDMOS transistor 1022 can be disabled/turned off while the voltage on the $V_{IN}$ terminal is low, which causes no to low current through the resistor 1024. No to low current through the resistor 1024 results in no to a low voltage drop across the resistor 1024. The source-to-gate voltage ($V_{SG}$) of the PMOS transistor 1026 becomes lower than a threshold voltage of the PMOS transistor, and the PMOS transistor 1026 can be disabled. Because the PMOS transistor 1026 is disabled, the positive power supply ($V_{DD}$) terminal can be disconnected from the $V_{IN}$ terminal.

As the voltage on the $V_{IN}$ terminal increases to the operating voltage, the gate voltage of the LDMOS transistor 1022 also increases. As the $V_{GS}$ voltage of the LDMOS transistor 1022 increases above a threshold voltage of LDMOS transistor, the LDMOS transistor can be turned on and can enter a conducting state, resulting in current flowing through the resistor 1024 and a voltage drop across the resistor 1024. The voltage drop across the resistor 1024 increases the $V_{SG}$ of the PMOS transistor 1026 to above the threshold voltage of the PMOS transistor. The PMOS transistor 1026 can be enabled and can enter a conducting state, which connects the positive power supply ($V_{DD}$) terminal to the $V_{IN}$ terminal.

The guard circuit of FIG. 10 may quarantine the various components of the bias circuit, such as OTA 710, that draws power from voltage source 1002 via the $V_{IN}$ terminal. By disconnecting the $V_{IN}$ terminal from the $V_{DD}$ terminal while the power source brings up the supply voltage, the bias circuit can be prioritized to draw power from the voltage source 1002, and the bias circuit can perform aforementioned the bias selection operation to remove charge from the isolation regions. Any effects from charge (e.g., electrons) migrating in the semiconductor substrate may not affect the bias circuit while the power source brings up the supply voltage. The guard circuit may permit the bias circuit to become operational (e.g., with sufficient head room) before other active circuitry (as described subsequently) becomes operational. In various other examples, the guard circuit may be omitted. Relative to FIG. 10, in such examples, the $V_{IN}$ terminal and the $V_{DD}$ terminal would be directly coupled (e.g., a same terminal).

The system 1000 also includes other circuits, such as a signal processing and driver circuit 1030. The signal processing and driver circuit 1030 includes a driver circuit 1032. The signal processing and driver circuit 1030 (including the driver circuit 1032) is coupled between the $V_{DD}$ terminal and the ground terminal. An output terminal of the driver circuit 1032 is coupled to a gate terminal of the LDMOS transistor 704. The signal processing and driver circuit 1030 may receive various signals and determine whether to cause the LDMOS transistor 704 to be open or closed, which results in a gate enable (GATE_EN) signal. The driver circuit 1032 receives the GATE_EN signal on an input terminal of the driver circuit 1032 and drives the voltage on the output terminal of the driver circuit 1032 (and hence, on the gate terminal of the LDMOS transistor 704) according to the GATE_EN signal. As described above, the guard circuit allows the signal processing and driver circuit 1030 to be powered on after the bias circuit becomes operational in removing the charge from the isolation region.

The components of the power source, the bias circuit, the guard circuit, and the signal processing and driver circuit 1030 may be in one or more isolation regions. The isolation region(s) in which the various circuits are coupled to the ISO terminal 232 of the bias circuit. For example, the signal processing and driver circuit 1030 and driver circuit 1032 are shown in FIG. 10 to be coupled to the ISO terminal 232. Similarly, the bias circuit and/or guard circuit may be in isolation region(s) coupled to the ISO terminal 232. In some examples, the bias circuit and/or guard circuit may be in isolation region(s) coupled to the $V_{IN}$ terminal or a ground terminal.

Although various examples have been described in detail, it should be understood that various changes, substitutions, and alterations can be made therein without departing from the scope defined by the appended claims.

What is claimed is:

1. An integrated circuit comprising:
a semiconductor substrate, the semiconductor substrate having a first region, a second region, and a third region each being an opposite conductivity type from the semiconductor substrate, the first region and the second region being respective current terminals of a switch comprising a transistor, the transistor having a control terminal, and the switch configurable to be in an on-state or in an off-state responsive to a voltage difference between the control terminal and one of the current terminals enabling or disabling a channel between the current terminals under the control terminal;
a first rectifying device having a first positive terminal and a first negative terminal, the first positive terminal coupled to the first region, the first negative terminal coupled to the third region, the first rectifying device configurable to set a voltage of the third region responsive to the switch being in the off-state; and
a second rectifying device having a second positive terminal and a second negative terminal, the second positive terminal coupled to a reference terminal, and the second negative terminal coupled to the third region, the second rectifying device configurable to set the voltage of the third region responsive to the switch being in the on-state.

2. The integrated circuit of claim 1, wherein the third region is an isolation region.

3. The integrated circuit of claim 2, wherein the third region includes at least one of: a buried layer, an n-well, or a p-well.

4. The integrated circuit of claim 1, wherein the semiconductor substrate includes the first rectifying device and the second rectifying device.

5. The integrated circuit of claim 4, wherein the third region is an isolation region that surrounds the first rectifying device and the second rectifying device.

6. The integrated circuit of claim 1, wherein the transistor is a first transistor, and the first rectifying device includes at least one of: (i) a diode having an anode coupled to the first positive terminal and a cathode coupled to the first negative terminal, or (ii) a diode-connected second transistor.

7. The integrated circuit of claim 1, wherein the transistor is a first transistor, and the second rectifying device includes a diode having an anode coupled to the second positive terminal and a cathode coupled to the second negative terminal.

8. The integrated circuit of claim 7, wherein:
the first rectifying device is enabled responsive to a first voltage difference between the first positive terminal and the first negative terminal exceeding a first voltage;
the second rectifying device is enabled responsive to a second voltage difference between the second positive terminal and the second negative terminal exceeding a second voltage; and
the second voltage is lower than the first voltage.

9. The integrated circuit of claim 1, wherein the transistor is a first transistor, and the second rectifying device includes:
a second transistor coupled between the third region and the reference terminal, the second transistor having a control terminal; and
an amplifier having a first amplifier input terminal and a second amplifier input terminal and an amplifier output terminal, the first amplifier input terminal coupled to the reference terminal, the second amplifier input terminal coupled to the third region, and the amplifier output terminal coupled to the control terminal.

10. The integrated circuit of claim 9, wherein the amplifier is configured to have a voltage offset between the first amplifier input terminal and the second amplifier input terminal, wherein a forward voltage of the second rectifying device is based on the voltage offset.

11. The integrated circuit of claim 1, wherein the second rectifying device includes a metal junction diode.

12. The integrated circuit of claim 1, wherein the transistor is a first transistor, and the integrated circuit further includes a second transistor coupled between the first region and the first positive terminal.

13. The integrated circuit of claim 12, wherein the second transistor is configured as a cascode device.

14. The integrated circuit of claim 12, wherein the first transistor is a laterally-diffused metal-oxide-semiconductor (LDMOS) transistor, and the second transistor is a junction field effect transistor (JFET).

\* \* \* \* \*